US006892374B2

(12) United States Patent
Melli et al.

(10) Patent No.: US 6,892,374 B2
(45) Date of Patent: May 10, 2005

(54) SYSTEMS AND METHODS FOR GENERATING AN ARTWORK REPRESENTATION ACCORDING TO A CIRCUIT FABRICATION PROCESS

(76) Inventors: Bruno P. Melli, 436 Ventana Way, Windsor, CO (US) 80550; David C. Burden, 408-1/2 E. Stuart, Fort Collins, CO (US) 80525; Matthew L. Biggio, 2600 Reed Mountain Ct., Fort Collins, CO (US) 80525

( * ) Notice: Subject to any disclaimer, the term of this patent is extended or adjusted under 35 U.S.C. 154(b) by 0 days.

(21) Appl. No.: 10/174,674

(22) Filed: Jun. 19, 2002

(65) Prior Publication Data

US 2003/0237072 A1 Dec. 25, 2003

(51) Int. Cl.⁷ .............................................. G06F 17/50
(52) U.S. Cl. .................................. 716/19; 716/9; 716/10
(58) Field of Search .............................. 716/2–6, 10–13, 716/16, 17, 19; 717/131; 713/2; 710/305; 707/9, 100; 703/15, 23; 702/188; 355/86; 250/492.1; 101/463.1

(56) References Cited

U.S. PATENT DOCUMENTS

| | | | |
|---|---|---|---|
| 5,197,016 A | | 3/1993 | Sugimoto et al. |
| 5,303,161 A | | 4/1994 | Burns et al. |
| 5,461,576 A | * | 10/1995 | Tsay et al. ...................... 716/6 |
| 5,533,179 A | * | 7/1996 | Kucukcakar et al. ........... 713/2 |
| 5,551,014 A | * | 8/1996 | Yoshida et al. ................ 716/11 |
| 5,666,288 A | * | 9/1997 | Jones et al. .................... 716/17 |
| 5,726,902 A | * | 3/1998 | Mahmood et al. .............. 716/6 |
| 5,764,530 A | * | 6/1998 | Yokomaku ..................... 716/12 |
| 6,470,482 B1 | * | 10/2002 | Rostoker et al. ................ 716/6 |
| 2002/0060296 A1 | * | 5/2002 | Van Der Veen .......... 250/492.1 |
| 2002/0108097 A1 | * | 8/2002 | Harris et al. ................... 716/11 |

OTHER PUBLICATIONS

NN70101084, "Producing integrated circuits from a circuit logic input", Octiber 1970, IBM Technical Disclosure Bulletin, vol. No.: 13, Issue No.: 5, pp.: 1084–1089.*
Hernifer et al., "PC board design anf fabrication using schematics, PADS–preform, and a laser printer", Nov. 2–6, 1994, Frontiers in Education Conference, 25–th Annual Conference, pp.: 111–115.*
Cook et al., "Automatic artwork generation for large scale integration", 4, Dec. 1967 Solid–State Circuits, IEEE Journal of , vol.: 2, Issue: 4, pp.:190–196.*
United Kingdom Search Report for Application No. GB 0313221.4 dated Oct. 28, 2003.

* cited by examiner

*Primary Examiner*—A. M. Thompson
*Assistant Examiner*—Helen Rossoshek

(57) ABSTRACT

In one embodiment, the present invention relates to a system for generating an artwork representation according to a circuit fabrication process. The system comprises a cell library that stores at least dimensional information associated with a plurality of circuit cells, wherein each of the plurality of circuit cells is defined by a sub-mask for a respective logical device according to the circuit fabrication process; an instance placement engine that generates a circuit layout that is defined by at least a specification file specifying an arrangement of logical devices and the cell library; and an artwork generator that generates an artwork representation that defines a mask for etching of the generated circuit layout according to the circuit fabrication process.

39 Claims, 5 Drawing Sheets

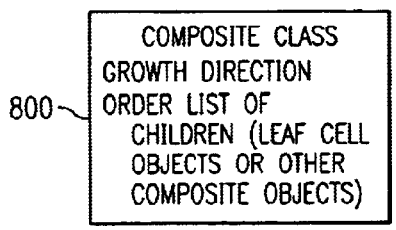
*FIG. 8*
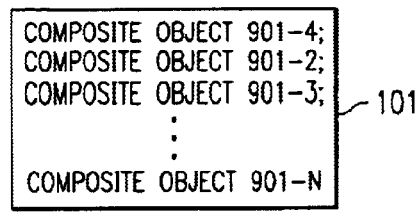
*FIG. 9*
*FIG. 10*
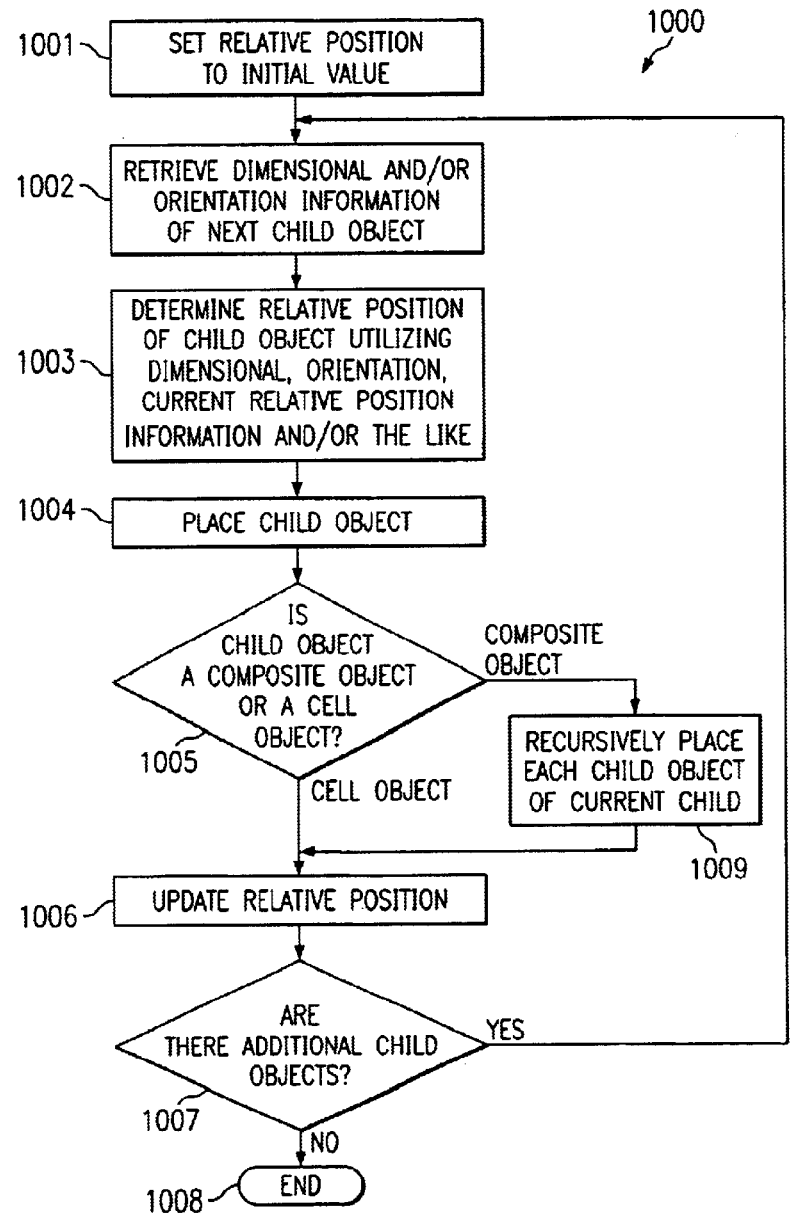

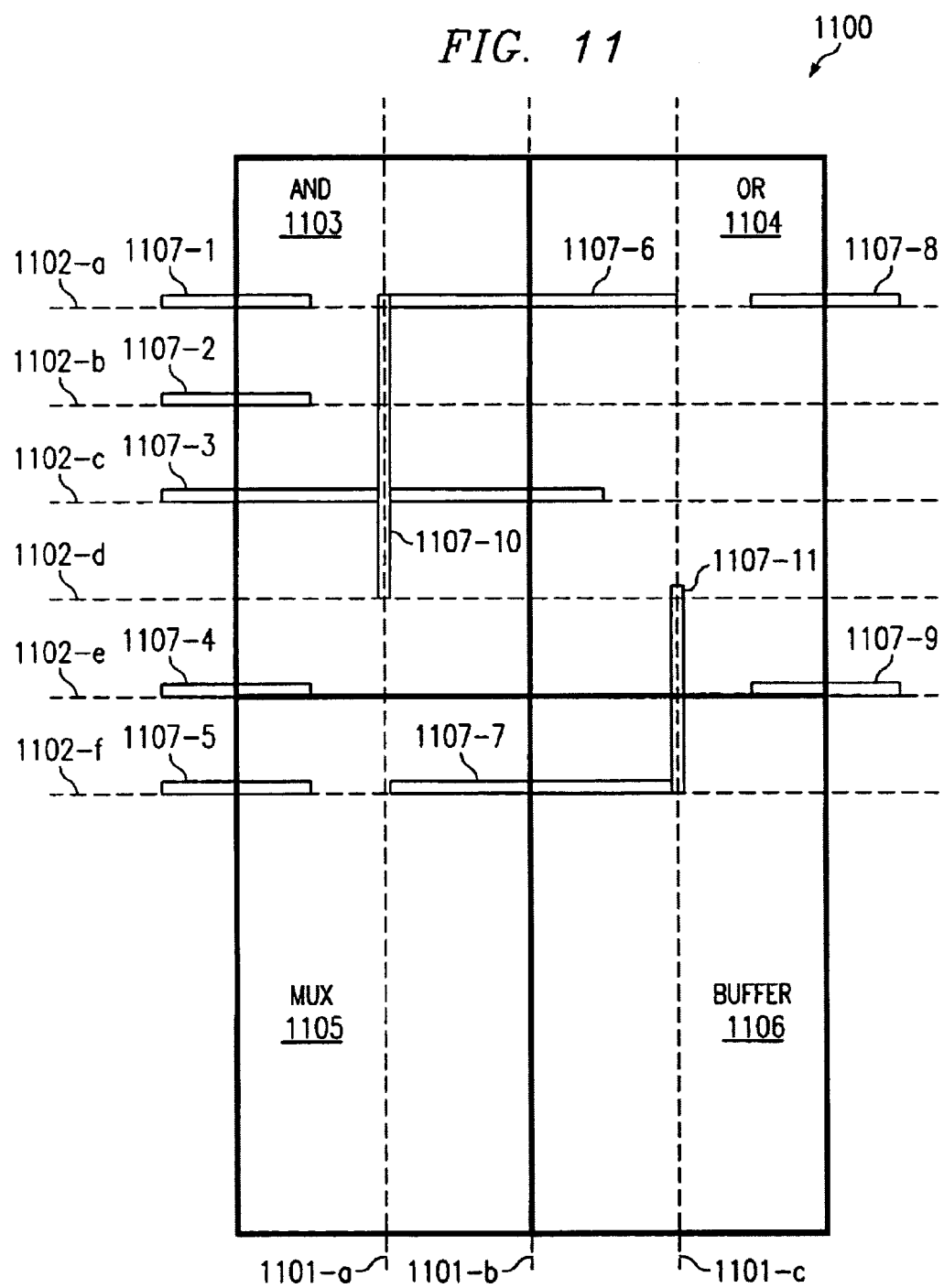

SYSTEMS AND METHODS FOR GENERATING AN ARTWORK REPRESENTATION ACCORDING TO A CIRCUIT FABRICATION PROCESS

TECHNICAL FIELD

The present invention relates in general to circuit design and in particular to systems and methods for creating circuit artwork from a specification file.

BACKGROUND OF THE INVENTION

Generally, one goal in the process of designing very large scale integration (VLSI) circuitry is the conversion of schematic circuit representations into artwork which incorporates detailed features of the ultimate circuit architecture. Artwork resulting from such a conversion is then generally used to generate masks used to etch a circuit on a chip.

Two approaches for generating the desired artwork are known in the art. A first prior art approach is to generate the desired artwork by hand. However, manual artwork generation is slow, prone to error, and extremely time consuming. Moreover, minor changes in sections of such artwork may require rework of entire circuit designs.

A second prior art approach involves the use of an automated tool to synthesize the artwork from a schematic or functional representation of the desired circuit. However, prior art automated tools generally control a great deal of the layout of resulting artwork, thereby depriving a human circuit designer of any significant control over a circuit's final layout. This lack of control over a circuit's layout may make subsequent circuit debugging difficult. Moreover, where an automated tool controls the circuit layout, the efficiency of the layout will generally be completely determined by decisions made by the automated tool. If the automated tool has not been updated to reflect the latest advances in VLSI processes, the resulting circuit may not perform appropriately, if at all.

BRIEF SUMMARY OF THE INVENTION

In one embodiment, the present invention relates to a system for generating an artwork representation according to a circuit fabrication process. The system comprises a cell library that stores at least dimensional information associated with a plurality of circuit cells, wherein each of the plurality of circuit cells is defined by a sub-mask for a respective logical device according to the circuit fabrication process; an instance placement engine that generates a circuit layout that is defined by at least a specification file specifying an arrangement of logical devices and the cell library; and an artwork generator that generates an artwork representation that defines a mask for etching of the generated circuit layout according to the circuit fabrication process.

BRIEF DESCRIPTION OF THE DRAWINGS

FIG. 8 depicts a composite class definition to abstractly represent a circuit element according to embodiments of the present invention.

FIG. 9 depicts an implementation of a specification file that comprises instantiated objects according to embodiments of the present invention.

FIG. 10 depicts a flowchart associated with computation of circuit elements according to embodiments of the present invention.

FIG. 11 depicts a user interface for placement of circuit elements according to embodiments of the present invention.

DETAILED DESCRIPTION OF THE INVENTION

Figure 1:
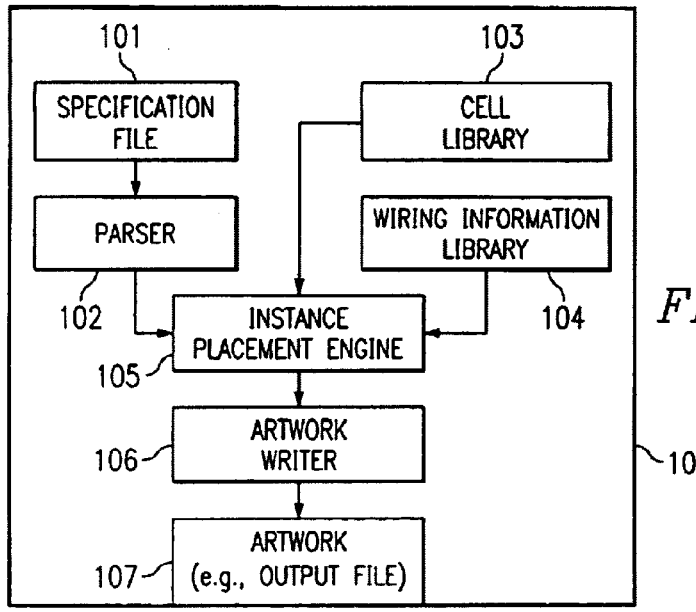
FIG. 1 is a block diagram of a system for converting a specification file into artwork according to embodiments of the present invention.

The present invention is directed to systems and methods for converting user instructions defining a circuit arrangement into a physical layout of a circuit. In embodiments of the present invention, a user may specify logical devices of the circuit, the relative placements of the logical devices, and interconnections between the logical devices in specification file. Additionally, the specification file may specify the various elements in a manner that is independent of the fabrication process for creating an actual circuit based on the specification file.

Embodiments of the present invention enable specification of a circuit layout in a manner that is independent of the particular fabrication process by utilizing an instance placement engine. The instance placement engine is advantageously operable to utilize the specification file and other resources (e.g., a cell library and/or a wiring information library) that are dependent on a particular fabrication process to create a circuit mask representation (e.g., "artwork"). By separating the specification file from the information that is dependent on the particular fabrication process, circuit design personnel are provided substantial freedom to design circuits for their functionality without being required to focus on layout details (e.g., gate sizes, minimum separation distances, and/or the like). Specifically, the instance placement engine advantageously retrieves the layout details from an appropriate source. From the relative placement engine and the layout details, the instance placement engine calculates the exact positions of the various circuit cells and wiring interconnections for creation of the circuit artwork.

Before discussing embodiments of the present invention in greater detail, it is appropriate to discuss various terms used to describe embodiments of the present invention. The term "cell" or "circuit cell" generally corresponds to a piece of artwork (e.g., a sub-mask for a respective logical device or devices according to a particular fabrication process) and generally represents one logic device, such as an AND gate, within a circuit being designed. The term "wire" generally corresponds to a continuous length of conductive material, usually metallic, on a given circuit layer; and the terms "wire contact" and "contact" generally correspond to an element which electrically couples wires located on different layers of a circuit. Examples of "layers" include doped silicon, polysilicon, oxide, and various different layers within a circuit. "Artwork" generally refers to information defining geometric information pertaining to a circuit with precision sufficient for fabrication of such circuit. Moreover, the terms "segment" or "track segment" generally refer to a subsection of a wire. The term "route" generally refers to a conductive path connecting two cells and may include one or more track segments. The term "port" generally corresponds to a region of electrical connection for a cell. It shall be appreciated the discussion of the preceding terms is provided solely for the convenience of the reader and is not intended to limit or provide any specialized meaning for the respective terms.

In embodiments of the present invention, the user specification may be in the form of a textual high level language which defines circuit components and the relative arrangements thereof. The user specification may also define circuit components and relative placement thereof in an object oriented manner. The specification may be either manually entered or generated by a program which converts a user defined circuit schematic into textual language.

Embodiments of the present invention perform the computationally demanding task of determining precise physical locations of various cells and track segments while still allowing users to define the layout, or order, of the various cells. Embodiments of the present invention thereby provide a desirable amounts of time and labor savings while enabling greater user control over resulting circuit layout than existing tools.

Moreover, embodiments of the present invention facilitate editing of specification files representing the circuit layout. For example, where a logical device or other element is to be added, removed, or modified, a user may readily edit a specification file to reflect the desired change and cause embodiments of the present invention to correspondingly modify the resulting artwork. Specifically, embodiments of the present invention may recalculate the physical layout of the circuit artwork in response to the change to the specification file. Accordingly, the user is advantageously relieved of a need to perform a large number of tedious, time consuming, and highly detailed modifications to an output file.

Therefore, it is an advantage of embodiments of the present invention that a user need not perform the time consuming, error-prone, and tedious process of manually creating and/or altering VLSI circuit artwork.

It is a further advantage of embodiments of the present invention that the user retains control over the selection and geometric layout of resulting artwork, thereby allowing the user to provide a sequence and arrangement of cells and wiring which has been optimized for various aspects of circuit performance.

It is a still further advantage of an embodiment of the present invention that specification files used to generate detailed circuit artwork may be readily edited by a user to add, delete, or modify cells, without requiring that the user specify fabrication process specific details of the resulting artwork.

Figures 5, 6, 7:
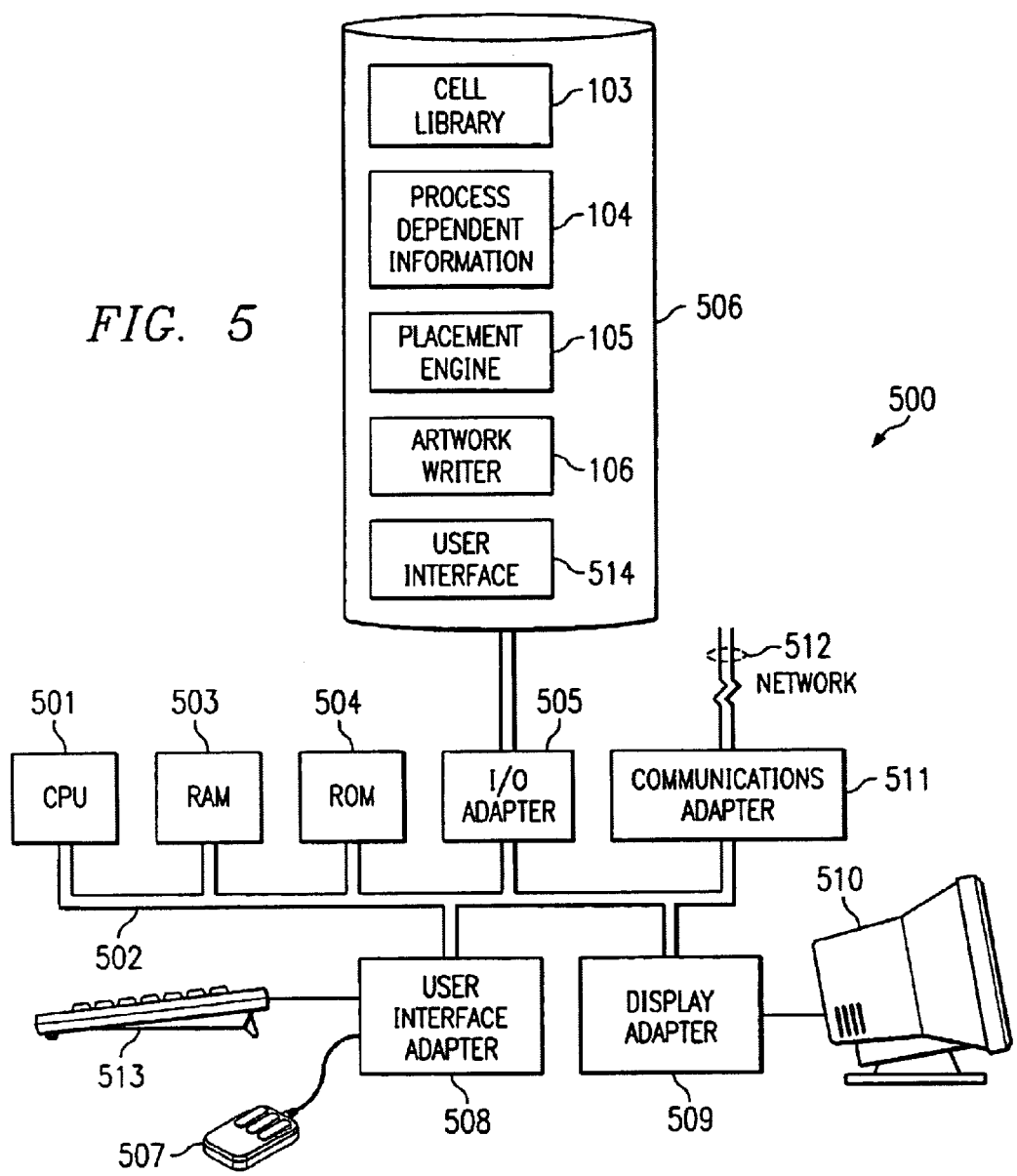
FIG. 5 depicts a computer system that may be utilized to implement embodiments of the present invention.
FIG. 6 depicts a component class definition to abstractly represent a circuit element according to embodiments of the present invention.
FIG. 7 depicts a cell class definition to abstractly represent a circuit element according to embodiments of the present invention.

FIG. 1 depicts components of system 100 for converting specification file 101 into artwork 107 according to an embodiment of the present invention. Advantageously, specification file 101 defines the content and layout of a circuit to be fabricated in a format which is readily editable and understandable to a human operator. Specification file 101 may be expressed in textual form (e.g., as a text file) and may be directly entered by a user using a keyboard, such as keyboard 513 (FIG. 5). Alternatively, specification file 101 may be produced after receiving information in the form of a user entered circuit schematic file. Specification file 101 advantageously defines a circuit layout by describing the relative location of cells with respect to each other and, optionally, wiring connections to be established between these cells. In this manner, the contents of specification file 101 advantageously remains independent of changes to a fabrication process implementing the logical devices and the wiring requirements of the fabrication process.

In embodiments of the present invention, parser 102 processes specification. Specifically, embodiments of the present invention advantageously define a syntax or command structure that permits identification of circuit specification by parser 102. For example, various codes or commands may define specific logical devices, interconnections between devices, relative positioning of circuit elements, and/or the like. Moreover, embodiments of the present invention advantageously define a syntax or command structure to permit a user to define a circuit "block." Specifically, the circuit "block" defines a repeatable structure comprising of defined logical devices interconnected in defined manner. Parser 102 advantageously parses the specification file according to syntax structure that facilitates identification of these circuit specification commands or codes.

The output of parser 102 is then advantageously presented to instance placement engine 105. Herein, the term "instance" generally corresponds to one implementation of a cell in a circuit to be constructed. Where the same type of cell is placed several times in a particular circuit, such multiple placements or implementations are each considered instances of the pertinent cell.

In embodiments of the present invention, cell library 103 stores detailed geometric information associated with all circuit components, such as size, shape, and port locations, according to a particular fabrication process, which may be used in associated with specification file 101. Embodiments of the present invention access cell library 103 to obtain geometric information concerning specific cells to be included in artwork 107. Similarly, the inventive mechanism advantageously acquires geometric wiring information, such as wire size, minimum permissible width of a wire, and the minimum spacing between adjacent wires, from process-dependent wiring information library 104 in order to appropriately allocate space for wiring in the preparation of artwork 107 (e.g., an output file).

Generally, the information provided to instance placement engine 105 from specification file 101 is advantageously independent of the implementation of cells defined in cell library 103 and of wiring information library 104. In this manner, the contents of specification file 101 may beneficially remain unchanged even as process-dependent information describing cells in cell library 103 and wiring information in wiring information library 104 undergo periodic revisions. For example, such revisions may occur because of changing process technology affecting the dimensions of cells and wiring. Thus, changes in the contents of cell library 103 and wiring information library 104 do not require changing specification file 101 in order to realize circuit artwork 107.

Instance placement engine 105 may advantageously combine the relative cell placement information in specification file 101 with geometrically detailed cell information in cell library 103 to provide precise positioning of cells. Artwork writer 106 employs information from wiring information library 104 to accurately place wiring connecting cells positioned by instance placement engine 105. Artwork writer 106 then advantageously generates artwork 107 from the information generated by instance placement engine 105 and wiring placement performed by artwork writer 106. As previously noted, artwork 107 is a representation of a circuit that sufficiently detailed to readily permit fabrication of the circuit by a fabrication facility. Specifically, artwork 107 may facilitate creation of a circuit mask or masks to etch the various layers of a desired circuit according to a particular fabrication process. Artwork 107 is advantageously written as an output file (e.g., a binary file) which may be stored in storage device 506 (FIG. 5).

Figure 2:
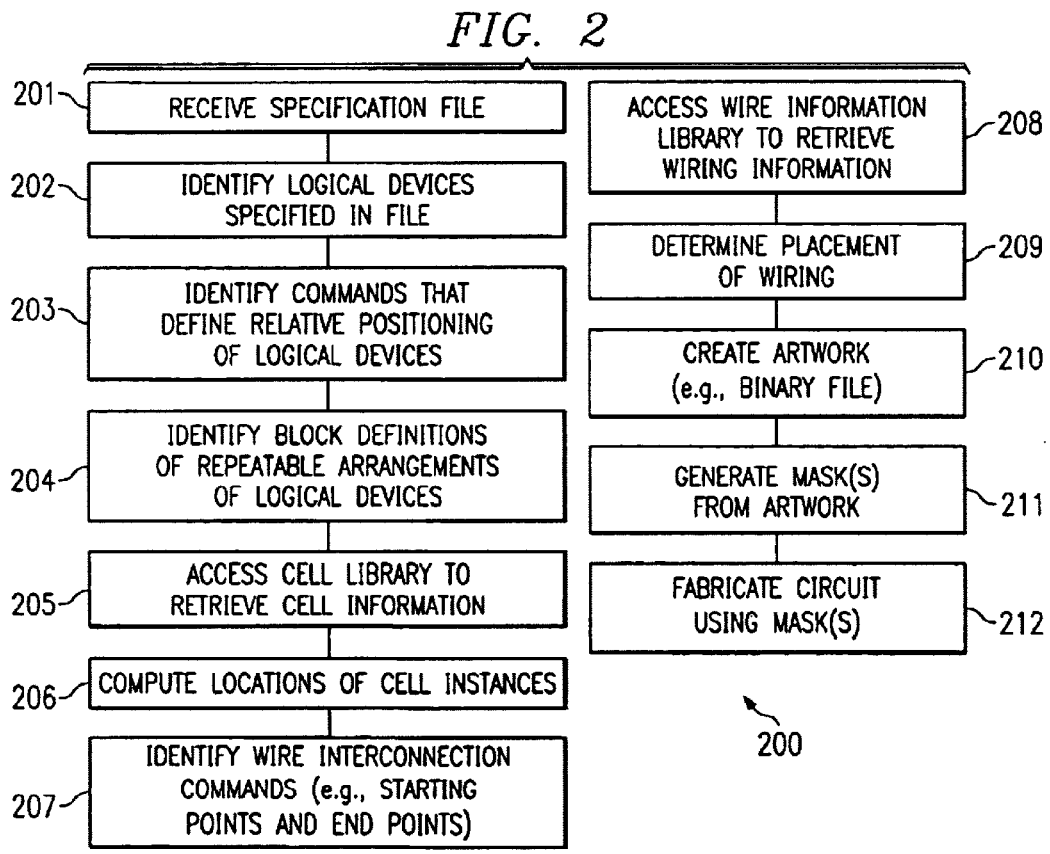
FIG. 2 is a flow diagram for generating artwork from a circuit specification according to embodiments of the present invention.

FIG. 2 depicts flowchart 200 for generating artwork from a circuit specification according to embodiments of the present invention. Flowchart 200 starts at step 201 where specification file 101 is received. In step 202, logical devices specified in specification file 101 are identified. In step 203, commands that identify the relative placement of the logical devices are identified from specification file 101. In step 204, block definitions that define repeatable arrangements of logical devices are identified from specification file 101.

In step 205, cell library 103 is accessed to retrieve cell information. For example, information related to the size and shape of the respective cells may be acquired. At step 206, computation of the locations for the instances of cells defined in specification file 101 occurs by employing information from both specification file 101 and cell library 103. In step 207, identification of wire interconnection commands (e.g., starting points and end points) may occur. In step 208, wire information library 104 is accessed to retrieve wiring information (e.g., minimum size, minimum separation distances, and/or the like). In step 209, the placement of wiring is determined by employing information from specification file 101, wiring information library 104, and the placement of cell instances performed in step 205. In step 210, artwork writer 106 may advantageously generate artwork 107 (e.g., a binary file).

It shall be appreciated that steps 201–210 of FIG. 2 may advantageously be implemented as executable code for controlling a suitable processor-based system. By implementing this portion of flowchart 200 in this manner, embodiments of the present invention enable circuit design to occur in an efficient manner. Specifically, a user may modify a single aspect of the specification file which renders a large number of changes to the ultimate circuit layout. However, the user is not required to recompute every cell location. Instead, the cell locations are recomputed without manual intervention by employing the operations of instance placement engine 105 and artwork writer 106.

In step 211, artwork 107 may be utilized to generate a mask or mask(s). This step may occur after artwork 107 has been provided to a fabrication facility. The fabrication facility then utilizes the generated mask to fabricate the desired circuit in substantial quantities (step 212).

Figure 3:
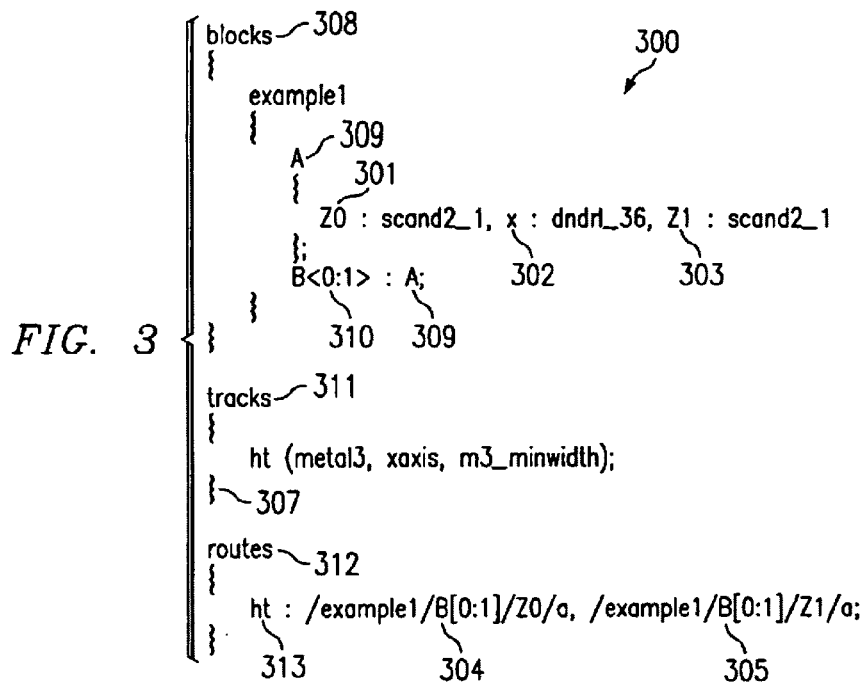
FIG. 3 depicts a sample specification file according to embodiments of the present invention.
Figure 4:
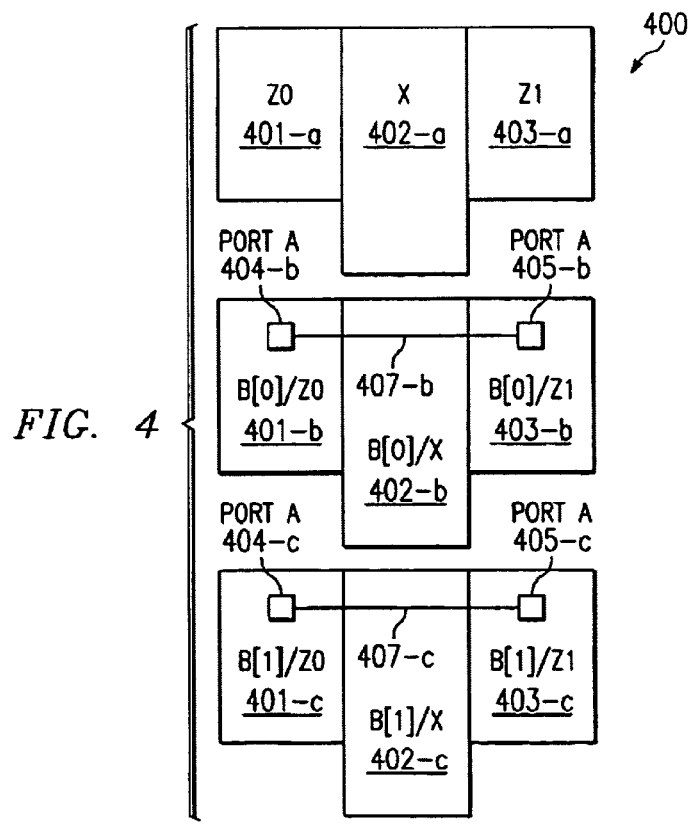
FIG. 4 depicts an output file of the inventive tool resulting from the sample specification file depicted in FIG. 3 according to embodiments of the present invention.

FIG. 3 depicts sample specification file 300 according to embodiments of the present invention, and FIG. 4 depicts an output file 400 resulting from the sample specification file depicted in FIG. 3. Sample specification file 300 advantageously represents one example of specification file 101 depicted in FIG. 1, and output file 400 represents one example of artwork 107 depicted in FIG. 1. FIG. 4 illustrates that the content of output file 400 incorporates cell and wiring dimension data from cell library 103 and wiring information library 104, respectively. Output file 400 is intended to be in a form which would allow a semiconductor fabrication facility to readily manufacture a chip from the information contained therein. Output file 400 is not intended to literally represent the physical appearance of a chip. Moreover, the geometric figures in depicted in output file 400 are merely provided for the convenience of the reader. In implementations, the geometric representations may advantageously be advantageously represented by computer code instead of the graphical illustrations as shown in FIG. 4.

In embodiments of the present invention, sample specification file 300 includes a sequence of entries defining various cells and the relative positioning thereof in a circuit to be constructed, as well as track segments electrically connecting these cells. In addition to referring to individual cells defined in cell library 103, blocks may be defined which refer to one or more cells. Such blocks, once defined, may be inserted at multiple locations within a circuit, thereby providing some labor savings. Moreover, blocks may be readily edited, thereby providing an ability to edit a pattern of cells for which many instances exist within a circuit by editing only a definition of the block. In this manner, repetitive editing of all instances of the block may be avoided. Sub-blocks may be defined within other blocks, thereby providing a range of repeatable circuit entities which may be re-used and edited as desired.

In embodiments of the present invention, "blocks" statement 308 introduces a sequence of blocks to be defined. Instance placement engine 105 of the present invention recognizes the following syntax for location of cells: a comma following a cell indicates that the next defined cell is placed to the right of the preceding cell. Entry of a semi-colon causes instance placement engine 105 to place cells succeeding this semi-colon at the left-most point in a new row below the cell preceding such semi-colon. The use of a full colon operates to associate a variable name with a cell or plurality of cells. It shall be appreciated that this syntax is provided as one example and the present invention is not limited to any particular syntax for defining relative positions of cell elements.

Continuing with the example, block A 309 is defined as including cells Z0 301, X 302, and Z1 303. Z0 301, X 302, and Z1 303 are variable names representing cells scand2__1, dndr1__36, and scand2__1, respectively. Cell scand2__1 may refer to a form of AND gate, and cell dndr1__36 may refer to a driver. It shall be appreciated that the instant example is generally directed toward the arrangement of cells according to embodiments of the present invention and not toward their function. Accordingly, the operation of the gates identified within block A 309 are discussed in detail herein. The statement for block A 309 is a block declaration which is re-usable within specification file 300 without having to retype the identification of the individual cells included within the original block declaration for block A 309.

Since commas are placed between cell Z0 301 and cell X 302, and between cell X 302 and cell Z1 303 within specification file 300, the corresponding realized cells 401-a, 402-a, and 403-a will be arranged along a single row in output file 400, as may be seen in FIG. 4. Herein, "realized cells" correspond to cells indicated as being part of artwork in an output file as opposed to cells defined in a specification file.

It may be seen that a semi-colon is present at the end of block A 309. Accordingly, subsequent entries to specification file 300 will be placed at the left-most location in a row below that on which the cells within block A were placed. Specification file 300 includes the statement "B<0:1>:A;" 310. Statement 310 illustrates an ability to reuse block A 309 which was previously defined.

In embodiments of the present invention, statement 310 defines a multiple repetition of a previously defined block. Statement 310 includes the syntax "0:1". This syntax operates to create two instances of block A 309 associated with each of index numerals "0" and "1." Moreover, the placement of a semi-colon between the numerals causes these two replicated instances of block A 309 to displaced vertically with respect to each other. Output file 400 in FIG. 4 displays the realization of this replication of block A in combination with information from dimensional information from cell library 103 and wiring information library 104.

Continuing with the example, it may be seen that the first replication of block A 309 in output file 400 includes realized cells B[0]/Z0 401(b), B[0]/X 402(b), and B[0]/Z1 403(b) which correspond to the instance of block A associated with numeral "0" in statement 310. Similarly, it may be seen that second replication of block A 309 in output file 400 includes realized cells B[1]/Z0 401(c), B[1]/X 402(c), and B[1]/Z1 403(c) which correspond to the instance of block A associated with numeral "1" in statement 310.

"Tracks" statement 311 introduces a section of specification file 300 in which certain characteristics of track segments may be defined, although not necessarily the placement of the track segments. The characteristics may describe the orientation, width, composition, respective layer, and/or the like of the track segments. Statement 307 declares a track segment named "ht" with three variables: "metal 3," "xaxis," and "m3_minwidth." The entry "metal 3" generally refers to a layer (e.g. a silicon layer of a chip) on which track segment "ht" is located. The entry "xaxis" generally corresponds to an axis along which track segment ht is disposed. And, the entry "m3_minwidth" generally corresponds to a minimum width permissible for track segment "ht." Within specification file 300, this minimum value is expressed as a variable, as shown within statement 307. A specific numerical value corresponding to this variable is stored within wiring information library 104 (FIG. 1).

451 Continuing with the example, "routes" statement 312 introduces a section of specification file 300 in which specific start and end points of track segments may be defined. Specifically, routes statement 312 defines the relative locations of two track segments utilizing the previously defined track characteristics. Routes statement 313 defines the start and end points of two track segments shown as realized track segments 407-b and 407-c in FIG. 4. Entry 304 operates to define respective start points for two track segments, a first starting at port "a" of B[0]/Z0 and a second at port "a" of B[1]/Z0. Entry 305 operates to define respective end points of these same two track segments, with the first such end point being at port "a" of B[0]Z1 and the second at port "a" of B[1]/Z1. In FIG. 4, it may be seen that track segment 407-b extends from port A 404-b of cell B[0]/Z0 401-b to port A 405-b of cell B[0]/Z1 403-b. FIG. 4 also depicts a second track segment 407-c extending from port A 404-c of cell B[1]/Z0 401-c to port A 405-c of cell B[1]/Z1 403-c.

With regard to the placement of cells in output file 400, it may be seen that the instances of the tallest block in each row, the "x" blocks, 402-a, 402-b, and 402-c, from top to bottom, are separated by small gaps. These gaps are for the purpose of clearly illustrating the separate instances of these cells within the various rows of output file 400. In an embodiment, the bottom portion of cell X 402-a would be contiguous with the top edge of cell B[0]/X 402-b, and the same would be true of the relationship between bottom edge of cell B[0]/X 402-b and the top edge of cell B[1]/X 402-c. Such contiguity would advantageously operate to benefi- cially minimize the amount of space occupied by a circuit resulting from output file 400. Alternatively however, some spacing between the various X blocks (402-a, 402-b, and 402-c) could be implemented. Likewise, cells arranged along a single row, such as cells 401-b, 402-b, and 403-b are advantageously placed immediately adjacent to their respective neighbors within a row to allow for optimum use of available space. However, in an alternative embodiment, cells disposed within a row could be placed non-contiguously. The variations may occur by specification of an appropriate user variable after a position syntax statement or may occur autonomously (e.g., by default when no variable is provided). Accordingly, all such variations are intended to be within the scope of the present invention.

When implemented via executable instructions, various elements of the present invention are in essence the code defining the operations of such various elements. The executable instructions or code may be obtained from a readable medium (e.g., hard drive media, optical media, EPROM, EEPROM, tape media, cartridge media, and/or the like) or communicated via a data signal from a communication medium (e.g., the Internet). In fact, readable media can include any medium that can store or transfer information.

FIG. 5 illustrates computer system 500 adapted according to embodiments of the present invention. Central processing unit (CPU) 501 is coupled to system bus 502. CPU 501 may be any general purpose CPU. However, the present invention is not restricted by the architecture of CPU 501 as long as CPU 501 supports the inventive operations as described herein. CPU 501 operates under the control of executable instructions. For example, CPU 501 may operate under the control of executable code that implements user interface 514, placement engine 105, artwork writer 106, and/or the like according to embodiments of the present invention.

Computer system 500 also includes random access memory (RAM) 503, which may be SRAM, DRAM, SDRAM, or the like. Computer system 500 includes ROM 504 which may be PROM, EPROM, EEPROM, or the like. RAM 503 and ROM 504 hold user and system data and programs as is well known in the art.

Computer system 500 also includes input/output (I/O) adapter 505, communications adapter 511, user interface adapter 508, and display adapter 509. I/O adapter 505 connects to storage devices 506, such as one or more of hard drive, CD drive, floppy disk drive, tape drive, to computer system 500. The computer-readable media associated with storage devices 506 may retain the executable code and/or the data associated with embodiments of the present invention. For example, storage devices 506 may retain the executable code implementing user interface 514, placement engine 105, artwork writer 106, and/or the like and the data associated with cell library 103 and wire information library 104.

Communications adapter 511 is adapted to couple computer system 500 to a network 512, which may be one or more of telephone network, local (LAN) and/or wide-area (WAN) network, Ethernet network, and/or Internet network. User interface adapter 508 couples user input devices, such as keyboard 513 and pointing device 507, to computer system 500. Display adapter 509 is driven by CPU 501 to control the display on display device 510.

As previously discussed, embodiments of the present invention are described in terms of a high level language for describing circuit elements and single letters for representing instances of these elements. Moreover, blocks at various levels of hierarchy may be defined to represent combinations of cells. Such blocks, once defined, are advantageously readily re-used within a specification file describing a circuit. In addition, such instances and blocks are advantageously readily edited to reflect a systemic change occurring throughout a circuit with a minimum amount of effort. The syntax described herein associates particular punctuation marks with specific relative placement of a cell succeeding the punctuation mark with respect to a cell preceding the punctuation mark.

It shall be appreciated by those of skill in the art that the embodiments of the present invention disclosed herein are not limited to any one particular language structure for defining cells or circuit elements, nor to any one syntax for specifying a relative placement of circuit elements within a circuit. Other mechanisms for specifying circuit elements and their relative placement may be employed. Moreover, a natural language syntax akin to that used in high-level computer programming languages may be employed, and all such variations are intended to be included within the scope of the present invention.

Additionally, embodiments of the present invention may define circuit elements in an object-oriented manner. As is known in the art, object oriented definition of data structures typically involves creating data structures that model pertinent real-life or task oriented elements. A class is a blueprint or prototype that models a particular element. In the context of the present invention, the defined classes model the various circuit elements. Classes may define various class members or variables (e.g., size, orientation, and/or the like) that describe the respective modeled circuit elements. Additionally, classes may be defined at various levels of generality. A top level class may define the minimum characteristics for a circuit element. Other classes may be sub-classes of the top level class. Specifically, the lower level classes may inherit from the respective top level class. The lower classes will therefore include all class members or variables of the top level class. The lower classes may specify additional class members or variables that define the lower classes in greater detail.

For example, a top level class (component class 600), as shown in FIG. 6, may be utilized to define a data structure to facilitate placement of circuit element objects by instance placement engine 105. Component class 600 may define information that is associated with any circuit element object that may be processed by instance placement engine 105. Component class 600 may define several class variables or members to define the associated instantiated objects such as relative placement information and orientation.

Cell class 700 (as depicted in FIG. 7) may be derived from component class 600 and may, therefore, inherit the properties of component class 600. Additionally, cell class 700 may define several class variables or members to hold various information associated with the cell artwork such as cell size and port locations. Cell class 700 may also comprise a class member or pointer that points to the actual artwork associated with the respective cell to permit generation of artwork 107 by artwork writer 106.

Composite cell 800 (as depicted in FIG. 8) may be derived from component class 600 and may, therefore, inherit the properties of component class 600. Composite cell 800 may be utilized to define a repeated block of circuit components. Accordingly, composite cell 800 may comprise an order list of children. The children are advantageously class members or objects that are instantiations of cell class 700 or instantiations of composite class 800. Composite cell 800 may further comprise a growth direction class member or variable to define the placement of the children circuit components in the ordered list.

FIG. 9 depicts specification file 101 implemented according to an object oriented approach. Specification file 101 comprises a plurality of composite objects 901-1 through 901-N. Specification file 101 may further specify the relative positions of composite objects 901-1 through 901-N utilizing any appropriate syntax (e.g., separated by semi-colons to specify positioning of the next object below the preceding object). Specification file 101 may further specify wiring objects as will be discussed in greater detail below.

FIG. 10 depicts flowchart 1000 that may be utilized to compute placement of circuit elements utilizing an object oriented definition according to embodiments of the present invention. Flowchart 1000 begins at step 1001 wherein the relative position is set to an initial value. In step 1002, dimensional and/or orientation information is retrieved for the next child object of a particular component object. From the current relative position information, the retrieved dimensional information, the retrieved orientation information, and/or the like, the relative position of the child object is computed (step 1003). In step 1004, the child object is placed. In step 1005, a logical comparison is made to determine whether the child object is a composite object or a cell object. If the child object is a cell object, no further processing of the particular object is required and the process flow proceeds to step 1006 where the relative position is updated in accordance with the placement of the child object and growth direction information. In step 1007, a logical comparison is made to determine whether there are additional child objects of the composite. If there are no further child objects, the process flow ends by proceeding to step 1008. If there are additional child objects, the process flow iterates by returning to step 1002.

If the logical comparison of step 1005 determines that the child object is a composite object, the child object comprises a number of child sub-objects (which may be either composite objects or cell objects) that remain to be placed. In this case, the process flow proceeds from step 1005 to step 1009. In step 1009, the process flow proceeds by recursively placing each child object of the composite object. Specifically, another relative placement value may be maintained for the purpose of placement of child objects of the composite object. The relative placement value is updated as each child of the composite object is placed. After recursive placement in step 1009, the process flow proceeds to step 1006 where the previous relative position value is updated.

Embodiments of the present invention may define wiring data structures in a similar object oriented manner. A track segment class may be defined to represent connections between two specific points or ports. The end points of a particular track segment object may be defined in reference to a cell object. A route class may be defined to represent groups of track segments that are electrically interconnected. Accordingly, route objects may comprise a list of track segment objects. Route objects may further be instantiated to specify the positioning of wiring interconnection relative to a composite object. Additionally, route objects may be instantiated with other pertinent information such as implementation in particular metal layers and growth directions. Embodiments of the present invention may utilize the respective instantiated objects of suitable classes to generate the wiring portion of artwork 106 by creating the representations of the wiring interconnections and the contact interconnections to the ports of the circuit cells.

Embodiments of the present invention may utilize any number of mechanisms or systems to generate specification file 101. For example, a suitable graphical user interface may be implemented to allow a user to define the relative placement of cells and their interconnections. FIG. 11 depicts user interface 1100 that may be utilized to create specification 101 according to embodiments of the present invention. User interface 1100 includes a plurality of vertical tracks 1101-*a* through 1101-*c* and a plurality of horizontal tracks 1102-*a* through 1102-*f*. Vertical tracks 1101-*a* through 1101-*c* and horizontal tracks 1102-*a* through 1102-*f* may respectively represent permissible locations for wiring segments on respective layers of a device to be constructed. Accordingly, tracks 1101-*a* through 1101-*c* and 1102-*a* through 1102-*f* may be utilized by the circuit designer to define the placement of wiring segments onto a circuit design (e.g., actual wiring interconnections may be placed relative to the tracks).

The user may place logical circuits (e.g., AND 1103, OR 1104, MUX 1105; and BUF 1106) at selected locations via the user interface. After placing the logical circuits, the user may place wire segments 1107-1 through 1107-11 on the ports of the logical circuits. The placement of wire segments 1107-1 through 1107-11 may occur relative to tracks 1101-*a* through 1101-*c* and 1102-*a* through 1102-*f*.

User interface 1100 may also permit the user to move selected ones of the logical circuits. In response, user interface 1100 may automatically readjust the placement of wire segments 1107-1 through 1107-11 to maintain the connectivity of the defined circuit layout (e.g., selected wire segments may automatically shrink or stretch as appropriate). If a new placement results in a conflict (e.g., two wire segments cross on the same semiconductor layer), user interface 1100 may note the conflict and remove the conflicting wire segments. The user may then manually redefine the wiring interconnections. After the circuit designer is satisfied with a circuit layout defined by user interface 1100, specification 101 may be automatically generated.

Accordingly, embodiments of the present invention may provide numerous advantages over artwork generation than known systems and known techniques. Embodiments of the present invention permit a circuit designer to maintain control over the circuit layout process. Specifically, the circuit designer may ensure that specific logical devices are positioned at defined locations relative to other logical devices. Thereby, a circuit designer may optimize the efficiency (e.g., operating speed, noise characteristics, and/or the like). However, the circuit designer is not required to specify the exact layout of the circuit. Instead, embodiments of the present invention may store fabrication process dependent information and may utilize the information to automatically calculate positions of logical devices. Additionally, such calculations may be automatically performed when the circuit designer modifies the circuit design or when the fabrication process is modified. In doing so, the circuit designer is relieved of performing a significantly cumbersome task and is permitted to focus the designer's efforts on more advantageous activities.

What is claimed is:

1. A system for generating an artwork representation according to a circuit fabrication process, comprising:

a cell library that stores at least dimensional information associated with a plurality of circuit cells, wherein each of said plurality of circuit cells is defined by a sub-mask for a respective logic device according to said circuit fabrication process;

an instance placement engine that generates a circuit layout that is defined by at least a specification file specifying an arrangement of logic devices and said cell library, wherein said instance placement engine calculates positions of logic devices in said circuit layout by separating adjacent logic devices identified in said specification file according to dimensional information stored in said cell library; and an artwork generator that generates an artwork representation that defines a mask for etching of said generated circuit layout according to said circuit fabrication process.

2. The system of claim 1 wherein said specification file is a text file.

3. The system of claim 2 further comprising: a parser that is operable to parse said text file.

4. The system of claim 1 wherein said instance placement engine is operable to identify circuit layout commands defining relative positioning of logic devices.

5. The system of claim 1 wherein said instance placement engine is operable to identify logic devices specified in said text file.

6. The system of claim 1 wherein said instance placement engine is operable to identify block definitions which specify repeatable arrangements of logic devices.

7. The system of claim 1 further comprising:

a wiring information library that specifies criteria for interconnection of circuit cells according to said circuit fabrication process;

wherein said artwork generator is operable to generate said artwork representation to include wiring interconnections defined in part by said specification file and said wire information library.

8. The system of claim 7 wherein said criteria for interconnection of circuit cells comprises a minimum wire size.

9. The system of claim 8 wherein said specification file defines starting and ending points of wires utilized to interconnect said logic devices.

10. The system of claim 1 wherein said artwork representation is a binary file.

11. A method for generating an artwork representation according to a circuit fabrication process, comprising:

receiving a specification file defining an arrangement of logic device;

accessing a cell library to retrieve circuit cell dimensional information defined by sub-masks of said logic devices according to said circuit fabrication process; and generating an artwork representation of a circuit according to said circuit fabrication process utilizing at least said specification file and said circuit cell dimensional information, wherein said generating calculates positions of logic devices by separating adjacent logic devices identified in said specification file according to cell dimensional information stored in said cell library.

12. The method of claim 11 wherein said specification file is a text file.

13. The method of claim 12 further comprising:

identifying circuit layout commands defining relative positioning of logic devices.

14. The method of claim 12 further comprising:

identifying logic devices specified in said text file.

15. The method of claim 12 further comprising:

identifying block definitions which specify repeatable arrangements of logic devices.

16. The method of claim 11 wherein said artwork representation is a binary file.

17. The method of claim 11 further comprising:
generating a circuit mask from said artwork representation.

18. The method of claim 11 further comprising:
fabricating circuits utilizing said circuit mask.

19. The method of claim 11 further comprising:
accessing a wire information library to obtain wiring information, wherein said wire information library comprises criteria for interconnection of logic devices according to said circuit fabrication process; and
generating wire interconnections in said artwork from at least said specification file and said wiring information.

20. The system of claim 11 wherein said specification file defines starting and ending points of wires utilized to interconnect said logic devices.

21. A system for generating an artwork representation according to a circuit fabrication process, comprising:
means for storing at least dimensional information associated with a plurality of circuit cells, wherein each of said plurality of circuit cells is defined by a sub-mask for a respective logic device according to said circuit fabrication process;
means for generating a circuit layout that is defined by at least a specification file specifying an arrangement of logic devices and said means for storing, wherein said means for generating calculates positions of logic devices in said circuit layout by separating adjacent logic devices identified in said specification file according to dimensional information stored in said means for storing; and
means for generating an artwork representation that defines a mask for etching of said generated circuit layout according to said circuit fabrication process.

22. The system of claim 21 wherein said specification file is a text file.

23. The system of claim 22 further comprising:
means for parsing said text file.

24. The system of claim 21 wherein means for generating a circuit layout is operable to identify circuit layout commands defining relative positioning of logic devices.

25. The system of claim 21 wherein means for generating a circuit layout is operable to identify logic devices specified in said text file.

26. The system of claim 21 wherein means for generating a circuit layout is operable to identify block definitions which specify repeatable arrangements of logic devices.

27. The system of claim 21 further comprising:
means for storing criteria for interconnection of circuit cells according to said circuit fabrication process;
wherein said means for generating an artwork representation is operable to generate said artwork representation to include wiring interconnections defined in part by said specification file and said means for storing criteria for interconnection.

28. The system of claim 27 wherein said criteria for interconnection of circuit cells comprises a minimum wire size.

29. The system of claim 28 wherein said specification file defines starting and ending points of wires utilized to interconnect said logic devices.

30. A system for designing a circuit, comprising:
a cell library that stores dimensional information associated with a plurality of circuit cells, wherein each of said circuit cells is defined by a sub-mask for a respective logic device according to a circuit fabrication process;
a specification file defining an arrangement of logic devices within said circuit using fixed relative positions that are independent of said circuit fabrication process, wherein said specification file is a high-level user editable file; and
an instance placement engine that generates a circuit layout that is defined by said specification file and said cell library.

31. The system of claim 30 wherein said specification file includes statements defining a repeatable block of logic devices.

32. The system of claim 31 wherein said statements defining a repeatable block of logic devices are implemented using an object oriented data structure.

33. The system of claim 30 wherein said specification file comprises statements indicating a termination of a row of logic devices.

34. The system of claim 30 wherein said specification file comprises statements defining an orientation, a width, and a layer of a track segment within said circuit.

35. The system of claim 30 further comprising:
a graphical user interface (GUI) process for presenting a graphical representation of said circuit and for receiving user input to place circuit elements on said graphical representation, wherein said GUI interface process autonomously modifies said specification file in response to receiving said user input.

36. A method for designing a circuit, comprising:
storing dimensional information, in a cell library, associated with a plurality of circuit cells, wherein each of said circuit cells is defined by a sub-mask for a respective logic device according to a circuit fabrication process;
creating a user-editable specification file according to statements of a high-level circuit description language, wherein said specification file defines an arrangement of logic devices within said circuit using fixed relative positions that are independent of said circuit fabrication process; and
generating a circuit layout by placing logic devices within said circuit according to said circuit fabrication process using said specification file and said cell library.

37. The method of claim 36 wherein said creating said specification file comprises:
defining repeatable blocks of logic devices according to selected statements of said high-level circuit description language.

38. The method of claim 36 wherein said high-level circuit description language is an object oriented language.

39. The method of claim 36 wherein specification file comprises statements defining orientation, width, and layer characteristics of track segments within said circuit.

* * * * *

UNITED STATES PATENT AND TRADEMARK OFFICE
CERTIFICATE OF CORRECTION

PATENT NO. : 6,892,374 B2
APPLICATION NO. : 10/174674
DATED : May 10, 2005
INVENTOR(S) : Bruno P. Melli et al.

It is certified that error appears in the above-identified patent and that said Letters Patent is hereby corrected as shown below:

Column 7, line 38, before "Continuing" delete "451"

Claim 3, Column 12, line 44, insert a paragraph break between "comprising:" and "a parser"

Claim 11, Column 12, line 44, delete "device" and insert therefor --devices--

Signed and Sealed this

Twentieth Day of May, 2008

JON W. DUDAS
*Director of the United States Patent and Trademark Office*